United States Patent
Park et al.

(10) Patent No.: US 12,010,929 B2
(45) Date of Patent: Jun. 11, 2024

(54) MEMORY DEVICE AND MANUFACTURING METHOD THEREFOR

(71) Applicant: INDUSTRY-UNIVERSITY COOPERATION FOUNDATION HANYANG UNIVERSITY ERICA CAMPUS, Ansan-Si (KR)

(72) Inventors: Tae Joo Park, Ansan-si (KR); Dae Woong Kim, Ansan-si (KR); Tae Jun Seok, Yongin-si (KR); Hye Rim Kim, Dongducheon-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 467 days.

(21) Appl. No.: 17/316,794

(22) Filed: May 11, 2021

(65) Prior Publication Data
US 2021/0273158 A1   Sep. 2, 2021

Related U.S. Application Data

(63) Continuation-in-part of application No. PCT/KR2019/018519, filed on Dec. 26, 2019.

(30) Foreign Application Priority Data

Dec. 26, 2018 (KR) .................. 10-2018-0169696

(51) Int. Cl.
*H01L 45/00* (2006.01)
*C23C 16/40* (2006.01)
(Continued)

(52) U.S. Cl.
CPC .......... *H10N 70/245* (2023.02); *C23C 16/40* (2013.01); *C23C 16/403* (2013.01);
(Continued)

(58) Field of Classification Search
CPC ............ G11C 13/0011; G11C 13/0069; H10N 70/245; H10N 70/826;
(Continued)

(56) References Cited

U.S. PATENT DOCUMENTS 7,713,592 B2   5/2010  Nguyen et al.
8,921,821 B2   12/2014  Yasuda et al.
(Continued)

FOREIGN PATENT DOCUMENTS

CN   105862012 A   * 8/2016   ............. C23C 16/30
JP   2013-546195 A   12/2013
(Continued)

OTHER PUBLICATIONS

Machine translation, Ditizio, Korean Pat. Pub. No. KR20130030739A, translation date: Sep. 14, 2023, Espacenet, all pages. (Year: 2023).*
(Continued)

*Primary Examiner* — Victoria K. Hall
(74) *Attorney, Agent, or Firm* — FINCH & MALONEY PLLC

(57) ABSTRACT

A memory device is provided. The memory device may comprise: a first electrode; a resistance change layer placed on the first electrode and containing an alkali metal and a transition metal; and a second electrode placed on the resistance change layer, wherein the content of the alkali metal in the resistance change layer ranges from 40 at % (exclusive) to 88 at % (exclusive).

18 Claims, 14 Drawing Sheets

(51) Int. Cl.
*C23C 16/455* (2006.01)
*C23C 16/52* (2006.01)
*G11C 13/00* (2006.01)
*H10N 70/00* (2023.01)
*H10N 70/20* (2023.01)

(52) U.S. Cl.
CPC .. *C23C 16/45529* (2013.01); *C23C 16/45553* (2013.01); *C23C 16/52* (2013.01); *G11C 13/0011* (2013.01); *G11C 13/0069* (2013.01); *H10N 70/023* (2023.02); *H10N 70/826* (2023.02); *H10N 70/8836* (2023.02)

(58) Field of Classification Search
CPC ...... H10N 70/881–8845; H10N 70/023; C23C 16/40; C23C 16/403; C23C 16/45553; C23C 16/52; C23C 16/45529
See application file for complete search history.

(56) References Cited

U.S. PATENT DOCUMENTS

| | | | |
|---|---|---|---|
| 9,121,098 | B2 | 9/2015 | Ditizio et al. |
| 9,331,274 | B2 | 5/2016 | Moradpour et al. |
| 10,090,461 | B2 | 10/2018 | Karpov et al. |
| 2006/0109708 | A1 | 5/2006 | Pinnow et al. |
| 2011/0084248 | A1 | 4/2011 | Hsieh et al. |
| 2012/0145987 | A1* | 6/2012 | Sei ................. H10N 70/881 257/E21.09 |
| 2012/0280224 | A1 | 11/2012 | Doolittle et al. |
| 2016/0265110 | A1 | 9/2016 | Hamalainen et al. |
| 2017/0148982 | A1* | 5/2017 | Karpov .............. H10N 70/881 |
| 2019/0044151 | A1* | 2/2019 | Elam .................. H01M 4/628 |
| 2020/0066338 | A1* | 2/2020 | Noshiro ............. G11C 13/0011 |
| 2020/0212300 | A1* | 7/2020 | Jung ................. G11C 13/0007 |
| 2020/0411760 | A1* | 12/2020 | Kurita ................ H10N 70/253 |

FOREIGN PATENT DOCUMENTS

| | | | | |
|---|---|---|---|---|
| JP | 2016-506635 A | | 3/2016 | |
| KR | 10-2010-0060615 A | * | 6/2010 | ....... H01L 21/02046 |
| KR | 10-2010-0060615 A | | 6/2010 | |
| KR | 10-2013-0030739 A | * | 3/2013 | ............. C23C 16/40 |
| KR | 10-2013-0030739 A | | 3/2013 | |
| KR | 10-2016-0122133 A | | 10/2016 | |
| KR | 10-1676322 B1 | * | 11/2016 | ........... H01L 41/083 |
| KR | 10-1676322 B1 | | 11/2016 | |
| KR | 10-2017-0026343 A | | 3/2017 | |
| WO | WO-2010029634 A1 | * | 3/2010 | ............. B82Y 10/00 |
| WO | WO-2018143611 A1 | * | 8/2018 | ........... B05D 3/0254 |
| WO | WO-2019187032 A1 | * | 10/2019 | ............. G11C 11/54 |

OTHER PUBLICATIONS

Machine translation, Kang, Korean Pat. Pub. No. KR20100060615A, translation date: Sep. 14, 2023, Espacenet, all pages. (Year: 2023).*
T. Aaltonen et al., Atomic Layer Deposition of Li2O—Al2O3 Thin Films, Oct. 4, 2011, Chemistry of Materials, vol. 23, pp. 4669-4675. (Year: 2011).*
Translation, Written Opinion of International Searching Authority, International Searching Authority, International application No. PCT/KR2019/018519, Apr. 8, 2020, all pages. (Year: 2020).*
Machine translation, Kong, Chinese Pat. Pub. No. CN105862012A, translation date: Sep. 14, 2023, Clarivate Analytics, all pages. (Year: 2023).*
M. Putkonen et al., Atomic layer deposition of lithium containing thin films, Dec. 14, 2009, J. Materials Chemistry, vol. 19, No. 46, pp. 8693-8888. (Year: 2009).*
Machine translation, Nakai, WIPO Pat. Pub. No. WO-2010029634-A1, translation date: Sep. 14, 2023, Google Translate, all pages. (Year: 2023).*
Machine translation, Park, Korean Pat. Pub. No. KR101676322B1, translation date: Sep. 14, 2023, Espacenet, all pages. (Year: 2023).*
Machine translation, Kong, WIPO Pat. Pub. No. WO2019187032A1, translation date: Sep. 14, 2023, Clarivate Analytics, all pages. (Year: 2023).*
Machine translation, Jeong, WIPO Pat. Pub. No. WO2018143611A1, translation date: Sep. 14, 2023, Clarivate Analytics, all pages. (Year: 2023).*
Chang et al., "Dual Ion Effect of the Lithium Silicate Resistance Random Access Memory", IEEE Electron Device Letters, vol. 35, No. 5, pp. 530-532 (May 2014).
Comstock et al., "Mechanistic Study of Lithium Aluminum Oxide Atomic Layer Deposition", Journal of Physical Chemistry 117, pp. 1677-1683 (2013).
International Search Report mailed Apr. 8, 2020 for International Patent Application No. PCT/KR2019/018519, 2 pages.
Written Opinion mailed Apr. 8, 2020 for International Patent Application No. PCT/KR2019/018519, 5 pages.

* cited by examiner

MEMORY DEVICE AND MANUFACTURING METHOD THEREFOR

TECHNICAL FIELD

The present invention relates to a memory device and a manufacturing method therefor, and more particularly, to a memory device disposed with a metal oxide layer between first and second electrodes, and a manufacturing method therefor.

BACKGROUND ART

Demand for memory is increasing rapidly throughout the world as various IoT-based technologies and products are commercialized, and accordingly, power consumption for storing and managing data is increasing exponentially. It is essential to improve amounts of power consumption of a memory device itself in order to fundamentally control the increase in power consumption.

A resistance change memory (ReRAM) is one of the next-generation low-power memories, and consumes 50 to 100 times less power when the memory is driven compared to the conventional non-volatile memory. A conductive bridging RAM (CBRAM) is a type of the ReRAM in which the memory is driven by changing a resistance of a material through the formation/dispersion of conductive filaments of metal ions. Since the amount of power consumption upon driving the memory is determined by the mobility of metal ions, it is essential to develop a technology that can be implemented by applying metal ions having high mobility to a structure of the CBRAM.

Therefore, various technologies related to the resistance change memory have been studied. For example, Korean Patent Publication No. 10-2016-0122133 (Application Number: 10-2016-7020931, Applicant: Microchip Technology Incorporated) discloses a method of forming a resistive memory cell, which includes the steps of: forming a lower electrode layer on a substrate; oxidizing an exposed area of the lower electrode layer to form an oxide area; removing an area of the lower electrode layer proximate to the oxide area, and accordingly, forming a lower electrode having a pointed tip area proximate to the oxide area; and forming an electrolyte area and the upper electrode over at least a portion of the lower electrode and the oxide area so that the electrolyte area is positioned between the upper electrode and the pointed tip area of the lower electrode. Further, various technologies related to the resistance change memory are continuously researched and developed.

Patent Document

Korean Patent Publication No. 10-2016-0122133

DETAILED DESCRIPTION OF THE INVENTION

Technical Problem

One technical problem to be solved by the present invention is to provide a memory device reduced in power consumption, and a manufacturing method therefor.

Another technical problem to be solved by the present invention is to provide a memory device having increased operating speed, and a manufacturing method therefor.

Still another technical problem to be solved by the present invention is to provide a memory device having high mass production, and a manufacturing method therefor.

Still another technical problem to be solved by the present invention is to provide a memory device used as CBRAM, and a manufacturing method therefor.

The technical problems to be solved by the present invention are not limited to the above.

Technical Solution

In order to solve the above-mentioned technical problems, the present invention provides a memory device.

According to one embodiment, the memory device includes a first electrode, a resistance change layer disposed on the first electrode and including an alkali metal and a transition metal, and a second electrode disposed on the resistance change layer, wherein the content of the alkali metal in the resistance change layer may be more than 40 at % and less than 88 at %.

According to one embodiment, when a voltage is applied to any one of the first electrode or the second electrode, ions of the alkali metal may form an ion bridge connecting the first electrode to the second electrode.

According to one embodiment, when a high level voltage greater than or equal to a reference voltage is applied between the first electrode or the second electrode, the ion bridge is formed between the first electrode and the second electrode so that the resistance change layer may have a low resistance state, and when a low level voltage less than or equal to the reference voltage is applied between the first electrode or the second electrode, the ion bridge formed between the first electrode and the second electrode is cut, so that the resistance change layer may have a high resistance state.

According to one embodiment, the content of the alkali metal in the resistance change layer may be higher than the content of the transition metal.

According to one embodiment, the alkali metal may include lithium (Li), and the transition metal may include aluminum (Al).

According to one embodiment, the resistance change layer may include a first resistance change layer containing the alkali metal, and a second resistance change layer including the transition metal, in which a plurality of the first resistance change layer and a plurality of the second resistance change layer may be alternately disposed.

In order to solve the above-mentioned technical problems, the present invention provides a CBRAM.

According to one embodiment, the CBRAM may include a memory device according to the above-described embodiment.

In order to solve the above-mentioned technical problems, the present invention provides a method of manufacturing a memory device.

According to one embodiment, the method of manufacturing the memory device includes forming a first electrode on a substrate, performing a first unit process for reacting a first precursor containing an alkali metal with a first reaction source, and a second unit process for reacting a second precursor containing a transition metal with a second reaction source to form a resistance change layer containing the alkali metal and the transition metal on the first electrode, and forming a second electrode on the resistance change layer, wherein the first unit process and the second unit process are separately and repeatedly performed a plurality of times, in which a repetition ratio between the first unit process and the second unit process may be controlled, thereby controlling the content of the alkali metal in the resistance change layer.

According to one embodiment, the repetition ratio between the first unit process and second unit process may be controlled such that a rate of the first unit process is more than 4 times and less than 16 times compared to a repetition rate of the second unit process.

According to one embodiment, the first unit process may include providing the first precursor on the first electrode, and providing the first reaction source on the first electrode provided with the first precursor, and the second unit process may include providing the second precursor on the first electrode, and providing the second reaction source on the first electrode provided with the second precursor, According to one embodiment, temperatures of the first unit process and the second unit process may be controlled such that the content of the alkali metal in the resistance change layer is higher than the content of the transition metal.

According to one embodiment, the first unit process and the second unit process may be performed at a temperature of 90° C. or less.

According to one embodiment, the first precursor may include lithium bis(trimethylsilyl)amide (LiHMDS), and the second precursor may include trimethylaluminium (TMA).

According to one embodiment, the first reaction source and the second reaction source may be the same as each other, and the first reaction source and the second reaction source may contain H2O.

Advantageous Effects of the Invention

The method of manufacturing the memory device according to the embodiments of the present invention includes forming a first electrode on a substrate, performing a first unit process for reacting a first precursor containing an alkali metal with a first reaction source, and a second unit process for reacting a second precursor containing a transition metal with a second reaction source to form a resistance change layer containing the alkali metal and the transition metal on the first electrode, and forming a second electrode on the resistance change layer, wherein the first unit process and the second unit process are separately and repeatedly performed a plurality of times, in which a repetition ratio between the first unit process and the second unit process may be controlled, so that the content of the alkali metal in the resistance change layer can be controlled. Accordingly, a memory device having low power consumption and high operating speed during driving can be provided. In addition, the resistance change layer is formed by atomic layer deposition (ALD), so that the high mass production can be facilitated.

BEST MODE

Hereinafter, preferred embodiments of the present invention will be described in detail with reference to the accompanying drawings. However, the technical idea of the present invention is not limited to the exemplary embodiments described herein and may be embodied in other forms. Further, the embodiments disclosed thoroughly and completely herein may be provided such that the idea of the present invention can be fully understood by those skilled in the art.

In the specification herein, when one component is mentioned as being on another component, it signifies that the one component may be placed directly on another component or a third component may be interposed therebetween. Further, thicknesses of films and regions in drawings may be exaggerated to effectively describe the technology of the present invention.

In addition, although terms such as first, second and third are used to describe various components in various embodiments of the present specification, the components may not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it may be understood that the term such as "include" or "have" herein is intended to designate the presence of feature, number, step, component, or a combination thereof recited in the specification, and the term does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

Figure 1:
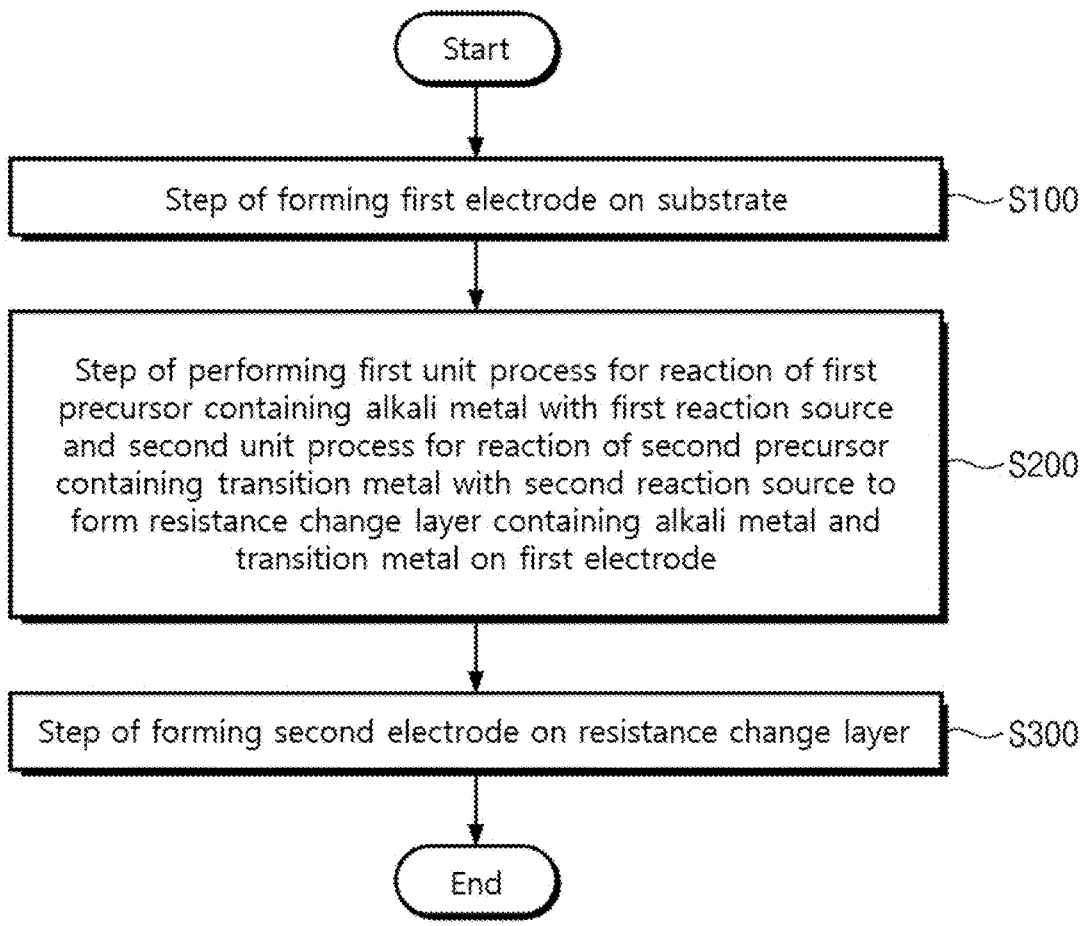
FIG. 1 is a flow chart illustrating a method of manufacturing a memory device according to the embodiments of the present invention.
Figure 2:
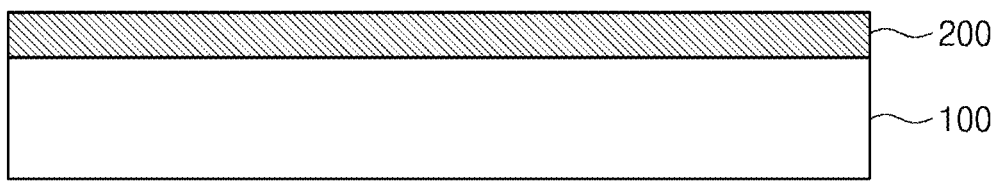
FIG. 2 is a view showing a step of forming a first electrode in the method of manufacturing the memory device according to the embodiments of the present invention.
Figure 3:
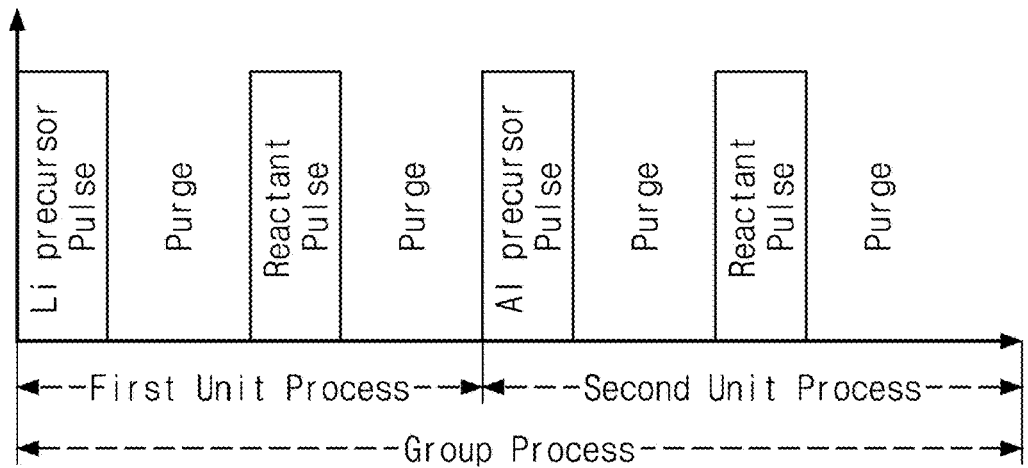
FIGS. 3 to 5 are views showing a step of forming a resistance change layer in the method of manufacturing the memory device according to the embodiments of the present invention.
Figure 4:
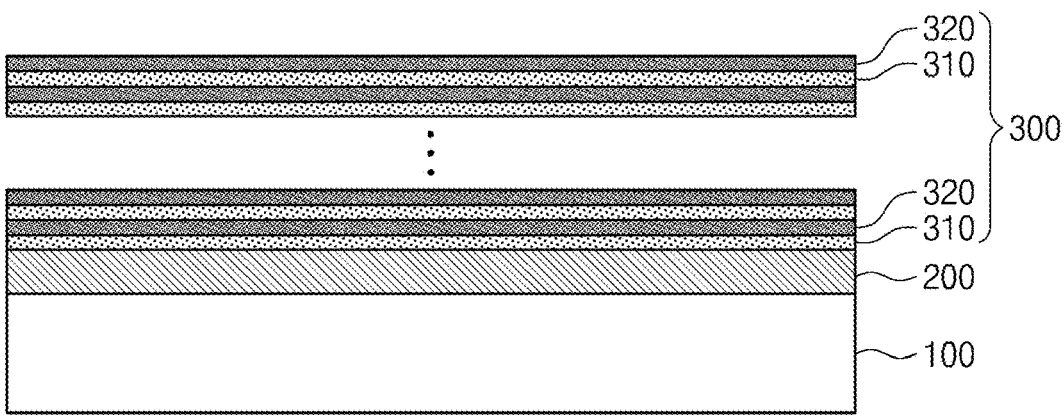
Figure 5:
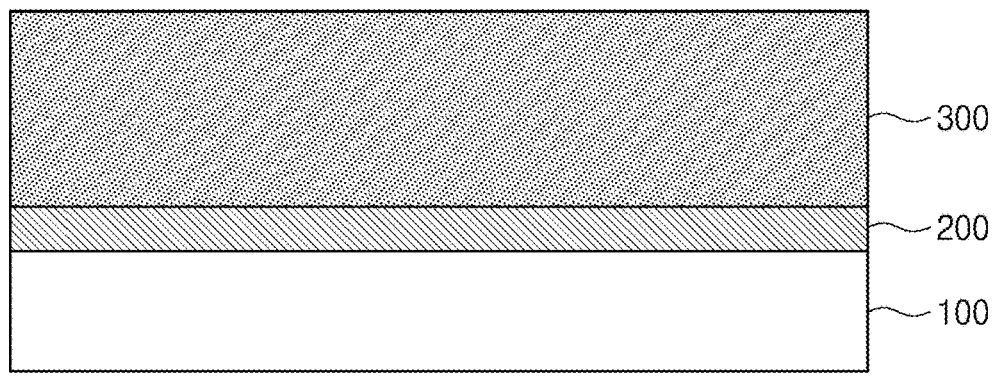
Figure 6:
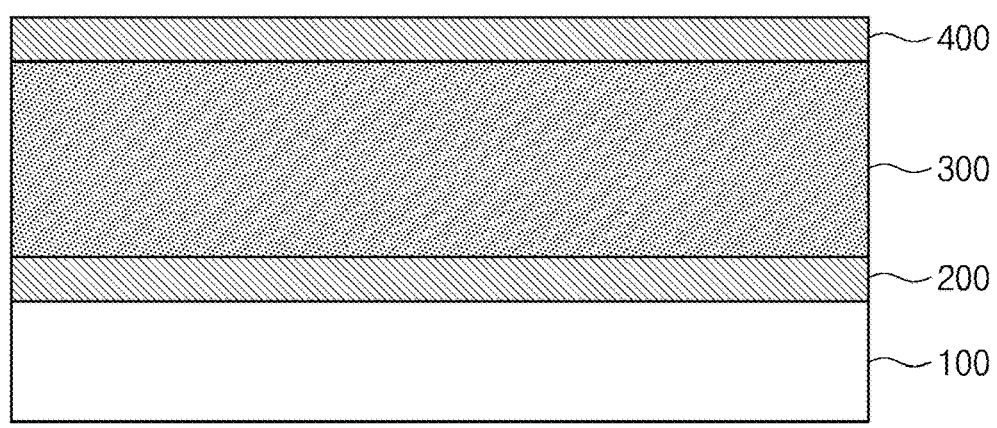
FIG. 6 is a view showing a memory device according to the embodiments of the present invention.
Figure 7:
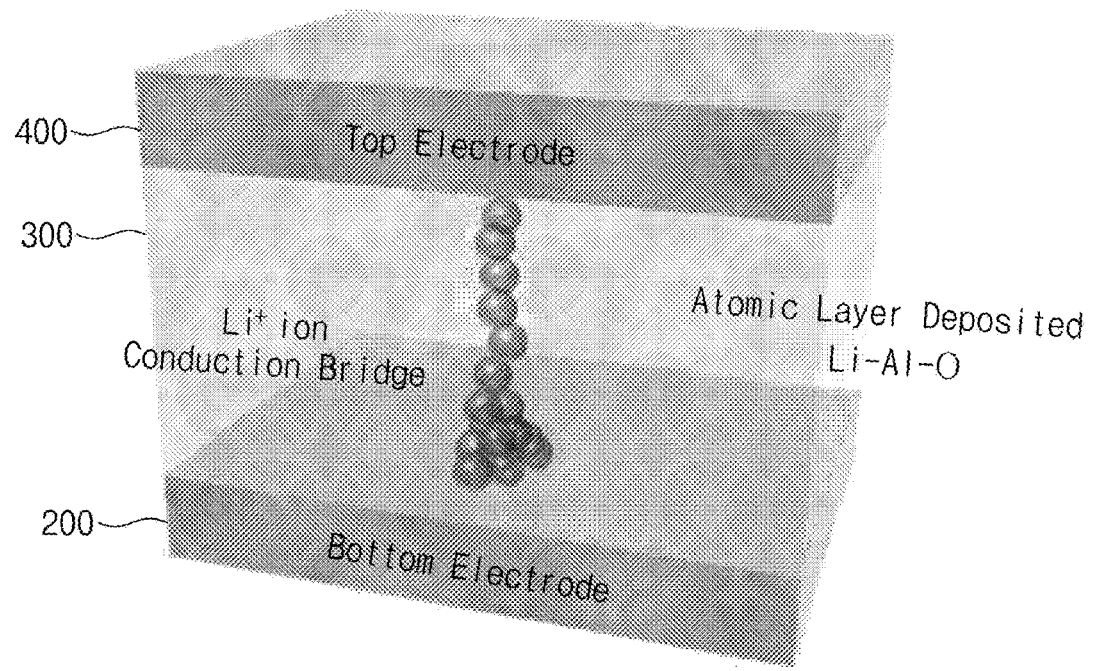
FIG. 7 is a view showing that an ion bridge is formed in a resistance change layer included in the memory device according to the embodiments of the present invention.

FIG. 1 is a flow chart illustrating a method of manufacturing a memory device according to the embodiments of the present invention. FIG. 2 is a view showing a step of forming a first electrode in the method of manufacturing the memory device according to the embodiments of the present invention. FIGS. 3 to 5 are views showing a step of forming a resistance change layer in the method of manufacturing the memory device according to the embodiments of the present invention. FIG. 6 is a view showing a memory device according to the embodiments of the present invention. FIG. 7 is a view showing that an ion bridge is formed in a resistance change layer included in the memory device according to the embodiments of the present invention.

Referring to FIGS. 1 and 2, a first electrode 200 may be formed on a substrate 100 (S100). According to one embodiment, the substrate 100 may be a semiconductor substrate. For example, the substrate 100 may include silicon oxide (SiO2). In contrast, according to another embodiment, the substrate 100 may be a metal substrate, a plastic substrate, a glass substrate, or the like.

The first electrode 200 may include a conductive metal material. For example, the first electrode 200 may include any one of platinum (Pt), ruthenium (Ru), titanium nitride (TiN), and tantalum nitride (TaN). According to one embodiment, the first electrode 200 may be formed on the substrate 100 by using a physical vapor deposition scheme. For example, the physical vapor deposition scheme may include sputtering.

Referring to FIGS. 1 to 5, a resistance change layer 300 may be formed on the first electrode 200 (S200). As described later, when a voltage greater than or equal to a reference voltage is applied between the first electrode 200 and the second electrode 400, an ion bridge connecting the first electrode 200 and the second electrode 400 may be formed on the resistance change layer 300. Further, in the resistance change layer 300, the resistance may be changed according to the magnitude of the voltage applied to the first electrode 200 and the second electrode 400, which will be described later. More details will be described later.

According to one embodiment, the resistance change layer 300 may be formed by atomic layer deposition. Specifically, as shown in FIG. 3, the step (300) of forming the resistance change layer may include a step of providing a first precursor on the first electrode 200, a purge step, a step of providing a first reaction source on the first electrode 200 provided with the first precursor, a purge step, a step of providing a second precursor on the first electrode 200, a purge step, a step of providing a second reaction source on the first electrode 200 provided with the second precursor, and a purge step.

According to one embodiment, the first precursor may include an alkali metal. For example, the alkali metal may include lithium (Li). Specifically, the first precursor may include lithium bis(trimethylsilyl)amide (LiHMDS) or lithium tert-butoxide (LiOtBu). In contrast, the second precursor may include a transition metal. For example, the transition metal may include aluminum (Al). Specifically, the second precursor may include trimethylaluminium (TMA). For another example, the transition metal may include titanium (Ti). Specifically, the second precursor may include titanium isopropoxide (TTIP).

According to one embodiment, the first reaction source and the second reaction source may be the same as each other. For example, the first reaction source and the second reaction source may contain water (H2O). Accordingly, the resistance change layer 300 may include the alkali metal (e.g., lithium), the transition metal (e.g., aluminum), and oxygen (O). In another example, the first reaction source and the second reaction source are identical to each other, and the first reaction source and the second reaction source include H2O or ozone (O3).

For another example, the first reaction source and the second reaction source may be different from each other. For example, the first reaction source may be ozone (O3), and the second reaction source may be water (H2O). In this case, the leakage current reduction effect may be improved.

The first precursor providing step-the purging step-the first reaction source providing step-the purging step may be defined as a first unit process. Whereas, the second precursor providing step-the purging step-the second reaction source providing step-the purging step may be defined as a second unit process. In addition, when the first unit process and the second unit process are sequentially performed, the first unit process and the second unit process may be defined as a group process.

According to one embodiment, when the first unit process is performed, a first resistance change layer 310 may be formed. In other words, the first precursor and the first reaction source are reacted, so that the first resistance change layer 310 may be formed. In contrast, when the second unit process is performed, a second resistance change layer 320 may be formed. In other words, the second precursor and the second reaction source are reacted, so that the second resistance change layer 320 may be formed.

According to one embodiment, the group process may be repeatedly performed. Accordingly, the first resistance change layer 310 and the second resistance change layer 320 may be alternately and repeatedly formed on the first electrode 200. In this case, the first resistance change layers 310 and the second resistance change layers 320 may be defined as the resistance change layer 300.

According to another embodiment, each of the first unit process and the second unit process may be repeatedly performed a plurality of times. When the first unit process and the second unit process are repeatedly performed a plurality of times, each thickness of the first resistance change layer 310 and the second resistance change layer 320 may be controlled. For example, when the number of repetitions of the first unit process is increased, the thickness of the first resistance change layer 310 may be increased. In addition, when the number of repetitions of the second unit process is increased, the thickness of the second resistance change layer 320 may be increased. Accordingly, the first resistance change layer 310 and the second resistance change layer 320, which are controlled in thickness, may be disposed on the first electrode 200. In this case, the first resistance change layer 310 and the second resistance change layer 320 controlled in thickness may be defined as the resistance change layer 300.

According to one embodiment, the first resistance change layer 310 and the second resistance change layer 320 of the resistance change layer 300 may not be physically and visually distinguished. More specifically, when the first resistance change layer 310 and the second resistance change layer 320 do not have thicknesses equal to or greater than a predetermined thickness, respectively, the first resistance change layer 310 and the second resistance change layer 320 in the resistance change layer 300 may not be physically and visually distinguished.

In contrast, according to another embodiment, the first resistance change layer 310 and the second resistance change layer 320 of the resistance change layer 300 may be physically and visually distinguished. More specifically, when the first resistance change layer 310 and the second resistance change layer 320 are formed to have the predetermined thickness or more, the first resistance change layer 310 and the second resistance change layer 320 in the resistance change layer 300 may be physically and visually distinguished through an SEM photograph and a TEM photograph.

According to one embodiment, the ratio between the first unit process and the second unit process may be controlled in order to control the content of the alkali metal in the resistance change layer 300. More specifically, the repetition ratio of the first unit process and the second unit process is 4:1, the content of the alkali metal in the resistance change layer may be 40 at %. In contrast, the repetition ratio between the first unit process and the second unit process is 9:1, the content of the alkali metal in the resistance change layer may be 60 at %. In contrast, the repetition ratio of the first unit process and the second unit process is 16:1, the content of the alkali metal in the resistance change layer may be 88 at %.

In other words, when the repetition ratio between the first unit process and second unit process is controlled such that a rate of the first unit process is more than 4 times and less than 16 times compared to a repetition rate of the second unit process, the content of the alkali metal in the resistance change layer 300 may be controlled to be greater than 40 at % and less than 88 at %. In the above-described content range of the alkali metal, the electrical characteristics of a memory device to be described later may be improved. Specifically, in the above-described content range of the alkali metal, the on/off characteristics (ION/IOFF ratio) of the memory device to be described later may be improved.

In addition, the content of the alkali metal (e.g., lithium) in the resistance change layer 300 may be higher than the content of the transition metal (e.g., aluminum). In this case, a current (reset current), an on-current (LRS), an off-current (HRS), and the like required for reset of the memory device to be described later are reduced, so that it may be effectively driven at low power.

According to one embodiment, temperatures of the first unit process and the second unit process may be controlled so that the content of the alkali metal (e.g., lithium) in the resistance change layer 300 is controlled to be higher than the content of the transition metal (e.g., aluminum). For example, the first unit process and the second unit process may be performed at a temperature of 90° C. or less. More specifically, the growth rate of the first resistance change layer 310 formed through the first unit process may vary according to the temperature. For example, the growth rate of the first resistance change layer 310 formed at a low temperature of 90° C. or less may be greater than the growth rate of the first resistance change layer 310 formed at a high temperature of 225° C. or higher.

Accordingly, the deposition process temperature of the resistance change layer 300 may be controlled to be relatively low such that the content of the alkali metal in the resistance change layer 300 becomes high, and accordingly, the resistance change layer 300 including the relatively high alkali metal content may be easily formed.

Referring to FIGS. 1 and 6, the second electrode 400 may be formed on the resistance change layer 300 (S300). Thus, the memory device according to the embodiment may be fabricated. According to one embodiment, the memory device may be used as a conductive bridging RAM (CBRAM).

The second electrode 400 may include a conductive metal material. According to one embodiment, the second electrode 400 may include the same material as the first electrode 200. For example, the second electrode 400 may include any one of platinum (Pt), ruthenium (Ru), titanium nitride (TIN), and tantalum nitride (TaN). According to one embodiment, the second electrode 400 may be formed on the resistance change layer 300 by using a physical vapor deposition scheme. For example, the physical vapor deposition scheme may include sputtering.

Referring to FIG. 7, when a high level voltage greater than or equal to a reference voltage is applied between the first electrode 200 and the second electrode 400, an ion bridge connecting the first electrode 200 to the second electrode 400 between the first electrode 200 and the second electrode 400 may be formed in the resistance change layer 300. The ion bridge may include ions of the above-described alkali metal (e.g., lithium). When the ion bridge is formed on the resistance change layer 300, the resistance change layer 300 may have a low resistance state.

In contrast, when a low level voltage less than or equal to the reference voltage is applied between the first electrode 200 and the second electrode 400, the ion bridge formed on the resistance change layer 300 may be extinguished or cut. Accordingly, the resistance change layer 300 may have a high resistance state.

As described above, the ion bridge is composed of lithium ions, so that a change in the state of the resistance change layer 300 may occur rapidly. In other words, the formation and extinction of the ion bridge may occur rapidly. Accordingly, the operating speed of the memory device may be increased.

According to one embodiment, the resistance conversion layer 300 may include a first area adjacent to the first electrode 200, a second area adjacent to the second electrode 400, and an intermediate area between the first area and the second area. In this case, as described above, the content of the alkali metal in the resistance change layer 300 may be greater than 40 at % and less than 88 at %, in which the content of the alkali metal may be increased or decreased from the first area to the intermediate area and from the second area to the intermediate area. Accordingly, the leakage current control effect may be improved. The content of the alkali metal, as described above, may be controlled according to the execution ratio between the first unit process and the second unit process. More specifically, in the area having a relatively low content of the alkali metal (e.g., lithium), a function of a barrier layer is performed to reduce the leakage current, so that the leakage current control effect may be improved.

The method of manufacturing the memory device according to the embodiments of the present invention includes forming the first electrode 200 on the substrate 100, performing a first unit process for reacting a first precursor containing an alkali metal with a first reaction source, and a second unit process for reacting a second precursor containing a transition metal with a second reaction source to form a resistance change layer 300 containing the alkali metal and the transition metal on the first electrode 200, and forming the second electrode 400 on the resistance change layer 300, wherein the first unit process and the second unit process are separately and repeatedly performed a plurality of times, in which a repetition ratio between the first unit process and the second unit process is controlled, so that the content of the alkali metal in the resistance change layer 300 can be controlled. Accordingly, a memory device having low power consumption and high operating speed during driving can be provided. In addition, the resistance change layer 300 is formed by atomic layer deposition (ALD), so that the high mass production can be facilitated.

Herein, the memory device and the manufacturing method therefor according to the embodiments of the present invention have been described. Hereinafter, results on specific experimental examples and characteristic evaluations will be described with respect to the memory device and the manufacturing method therefor according to the embodiments of the present invention.

Manufacturing of a Memory Device According to Experimental Example 1

After a lower titanium nitride (TiN) electrode was formed on an SiO2 substrate, processes of LiHMDS providing-purge-H2O providing-purge-TMA providing-purge-H2O providing-purge were performed to form a resistance change layer, and an upper titanium nitride (TIN) electrode was formed on the resistance change layer, so that a memory device according to the embodiment was manufactured.

In the above-described process, the LiHMDS providing-purge-H2O providing-purged was defined as a first unit process, the TMA providing-purge-H2O providing-purge was defined as a second unit process, and each unit process was repeated.

More specifically, the ratio between the first unit process and the second unit process was controlled to 1:9, so that the Li concentration(Li/(Li+Al)) in the resistance change layer was controlled to 5 at %. Accordingly, a memory device according to Experimental Example 1 was manufactured.

Manufacturing of a Memory Device According to Experimental Example 2

The same process as in Experimental Example 1 described above was performed except that the ratio between the first unit process and the second unit process was controlled to 1:1, so that the Li concentration(Li/(Li+Al)) in the resistance change layer was controlled to 30 at %. Thus, a memory device according to Experimental Example 2 was manufactured.

Manufacturing of a Memory Device According to Experimental Example 3

The same process as in Experimental Example 1 described above was performed except that the ratio between the first unit process and the second unit process was controlled to 4:1, so that the Li concentration(Li/(Li+Al)) in the resistance change layer was controlled to 40 at %. Thus, a memory device according to Experimental Example 3 was manufactured.

Manufacturing of a Memory Device According to Experimental Example 4

The same process as in Experimental Example 1 described above was performed except that the ratio between the first unit process and the second unit process was controlled to 9:1, so that the Li concentration(Li/(Li+ Al)) in the resistance change layer was controlled to 60 at %. Thus, a memory device according to Experimental Example 4 was manufactured.

Manufacturing of a Memory Device According to Experimental Example 5

The same process as in Experimental Example 1 described above was performed except that the ratio between the first unit process and the second unit process was controlled to 16:1, so that the Li concentration(Li/(Li+Al)) in the resistance change layer was controlled to 88 at %. Thus, a memory device according to Experimental Example 5 was manufactured.

The manufacturing processes of the memory devices according to the above-described Experimental Examples 1 to 5 may be summarized as shown in Table 1 below.

TABLE 1

| Item | First unit process:second unit process | Li content (Li/(Li + Al)) |
|---|---|---|
| Experimental Example 1 | 1:9 | 5 at % |
| Experimental Example 2 | 1:1 | 30 at % |
| Experimental Example 3 | 4:1 | 40 at % |
| Experimental Example 4 | 9:1 | 60 at % |
| Experimental Example 5 | 16:1 | 88 at % |

Figure 8:
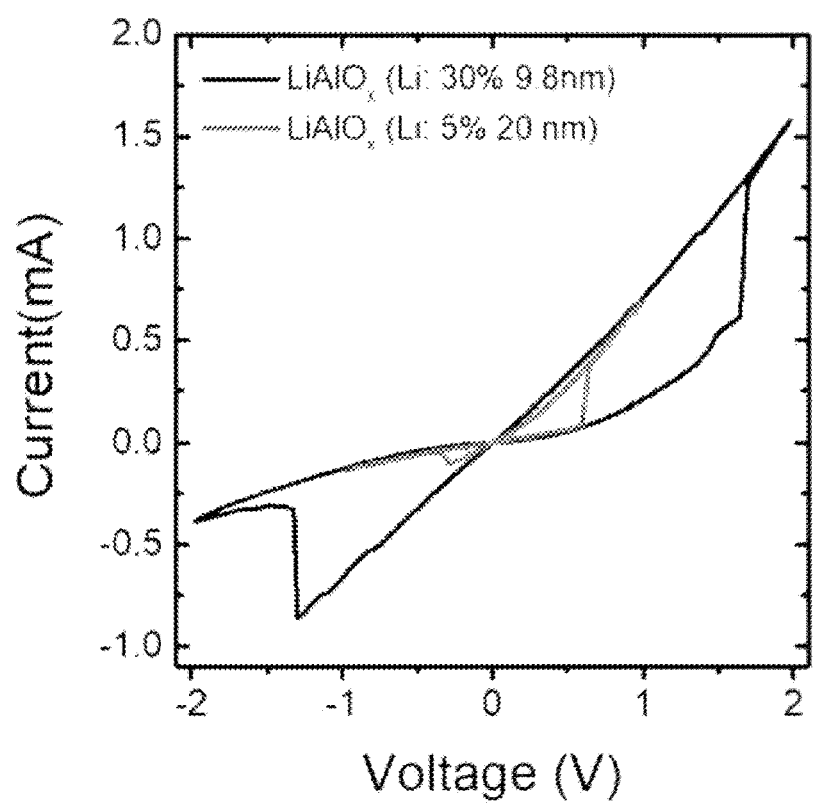
FIG. 8 is a graph showing a switching property of a CBRAM according to the embodiments of the present invention.

FIG. 8 is a graph showing switching properties of memory devices according to Experimental Examples 1 and 2 of the present invention.

FIG. 8 shows that, after preparing the memory devices according to Experimental Example 1 and Experimental Example 2, currents mA according to voltages V were measured, respectively. As shown in FIG. 8, it was confirmed that the memory devices according to Experimental Example 1 and Experimental Example 2 exhibited a typical atomic switching characteristic curve.

Figure 9:
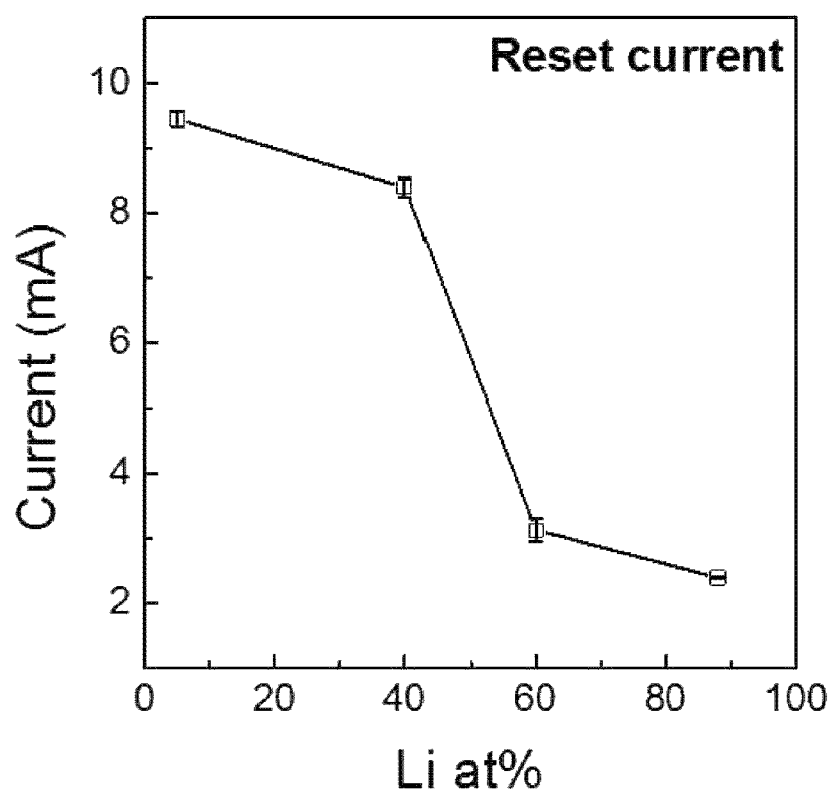
FIG. 9 is a graph showing a reset current according to the concentration of Li included in the resistance change layer.

FIG. 9 is a graph showing reset currents of memory devices according to Experimental Examples 1, 3, 4, and 5 of the present invention.

FIG. 9 shows that memory devices according to Experimental Examples 1 to 5 having different contents of lithium (Li) contained in the resistance change layer were prepared, and reset currents required for reset were measured with respect to the memory devices.

As shown in FIG. 9, it was confirmed that the current value required for reset was gradually decreased as the content of lithium contained in the resistance change layer was increased. In particular, it was confirmed that the current value required for reset was remarkably reduced when the lithium content in the resistance change layer exceeds 40 at %.

Figure 10:
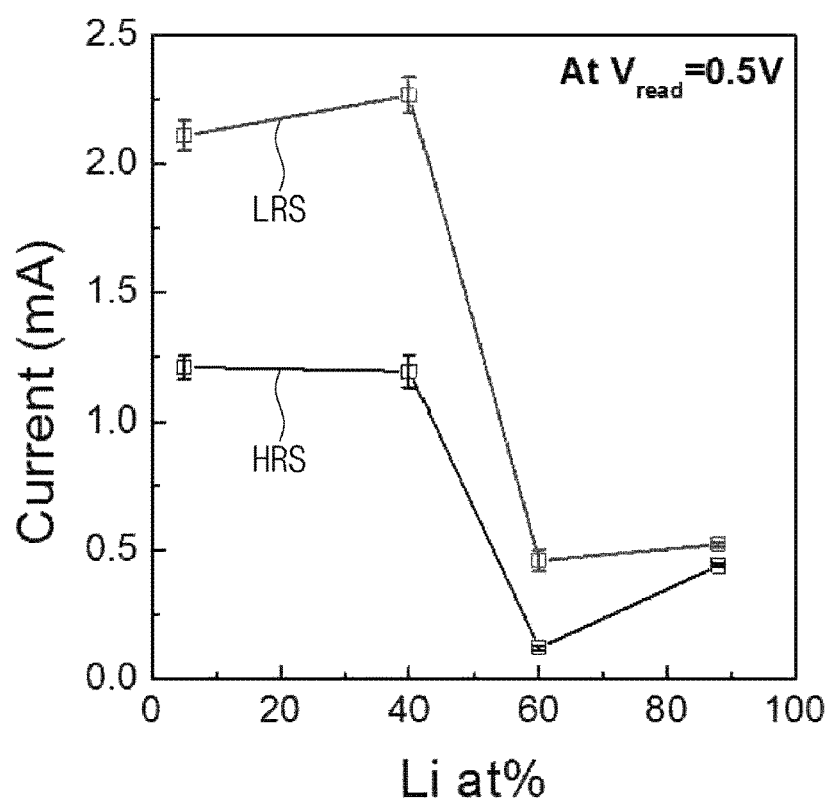
FIG. 10 is a graph showing an on-current and an off-current according to the concentration of Li included in the resistance change layer.

FIG. 10 is a graph showing on-current and off-current of memory devices according to Experimental Examples 1, 3, 4, and 5 of the present invention.

FIG. 10 shows that memory devices according to Experimental Examples 1 to 5 having different contents of lithium (Li) contained in the resistance change layer were prepared, and an on-current LRS and an off-current HRS were measured.

As shown in FIG. 10, it was confirmed that both of the on-current LRS and the off-current HRS are gradually decreased as the content of lithium (Li) contained in the resistance change layer was increased. In particular, it was confirmed that both of the on-current LRS and the off-current HRS are remarkably decreased when the lithium content in the resistance change layer exceeds 40 at %.

As shown in FIGS. 9 and 10, in the case of the memory device according to the Experimental Examples of the present invention, it can be seen that the lithium (Li) having the higher content in the resistance change layer is more effective for low-power driving.

Figure 11:
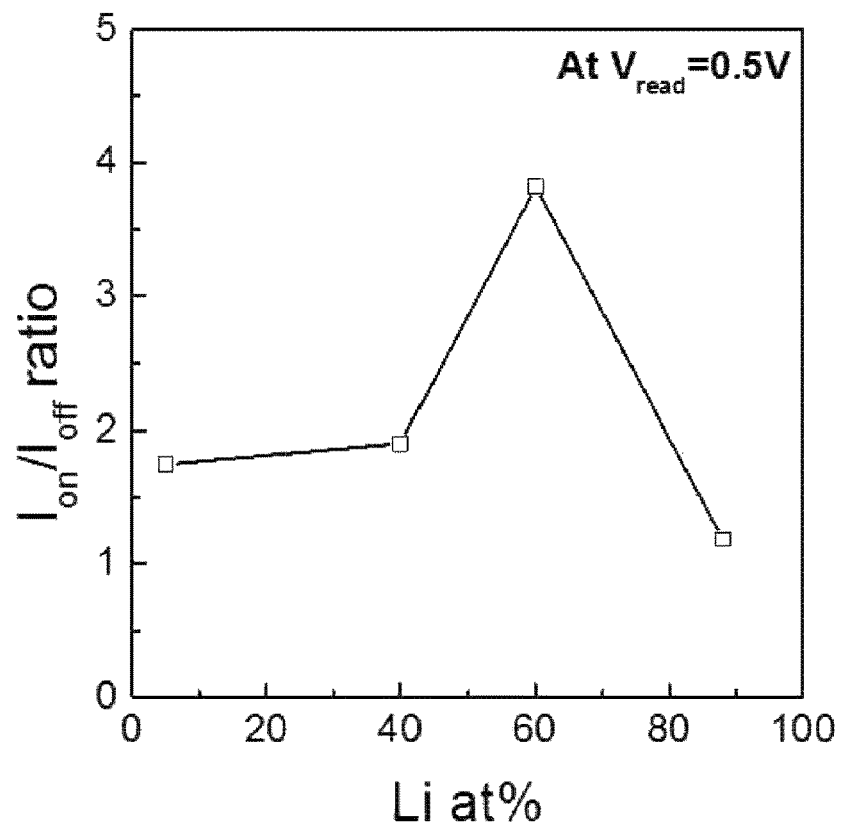
FIG. 11 is a graph showing the ION/IOFF ratio according to the concentration of Li included in the resistance change layer.

FIG. 11 is a graph showing the ION/IOFF ratio of memory devices according to Experimental Examples 1, 3, 4, and 5 of the present invention.

Figure 12:
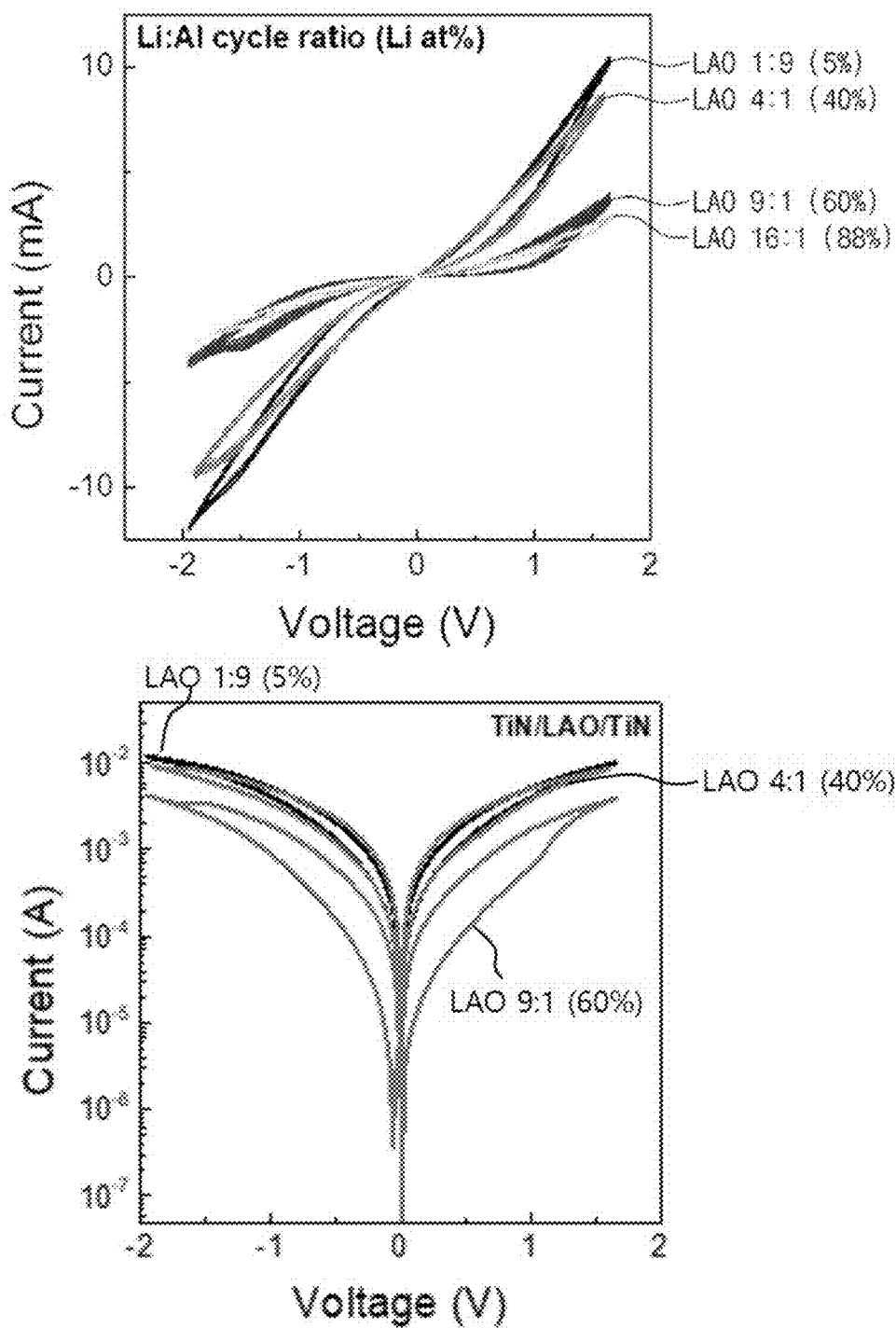
FIG. 12 is a graph showing an operating current property of a CBRAM according to the concentration of Li included in the resistance change layer.

FIG. 12 is a graph showing operating current characteristics of memory devices according to Experimental Examples 1, 3, 4, and 5 of the present invention.

Referring to FIGS. 11 and 12, FIG. 11 shows that the on/off characteristics (ION/IOFF ratio) of the memory devices according to Experimental Examples 1 to 5 were measured, and FIG. 12 shows that the operating currents according to the operating voltage V were measured.

As shown in FIGS. 11 and 12, it was confirmed that the operating current is decreased in the same operating voltage section when the Li content is increased. In addition, it was confirmed that the ION/IOFF ratio was increased rapidly from the section where the Li content exceeds 40 at %, had a peak value at 60 at % and was gradually decreased to 88 at % thereafter.

Accordingly, the content of lithium (Li) is required to be controlled in order to improve the electrical characteristics of the memory device. It is found that the lithium content is required to be controlled to more than 40 at % and less than 88 at % in order to improve the electrical characteristics of the memory device since the highest ION/IOFF ratio is exhibited when the lithium content is 60 at %.

In addition, in order to control the lithium content to be more than 40 at % and less than 88 at %, it is found that the repetition ratio between the first unit process and second unit process is required to be controlled such that the rate of the first unit process is more than 4 times and less than 16 times compared to the repetition rate of the second unit process, during forming the resistance change layer.

Figure 13:
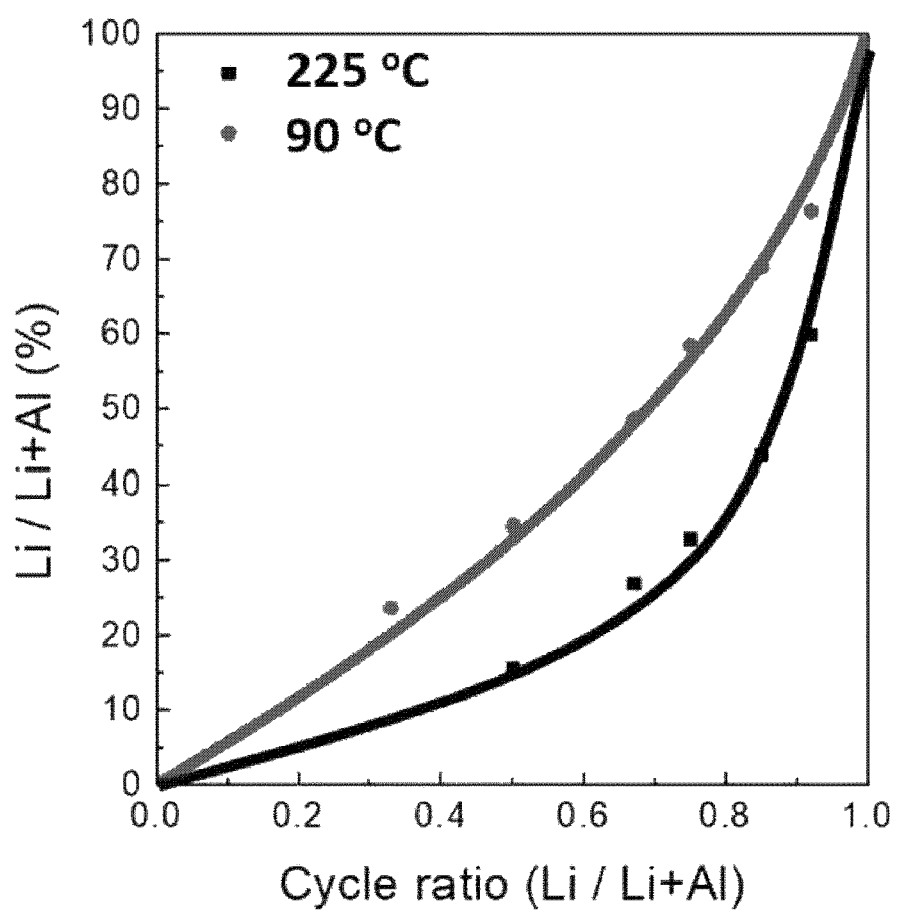
FIG. 13 is a graph showing the growth rates of resistance change layers formed at different temperatures.
Figure 14:
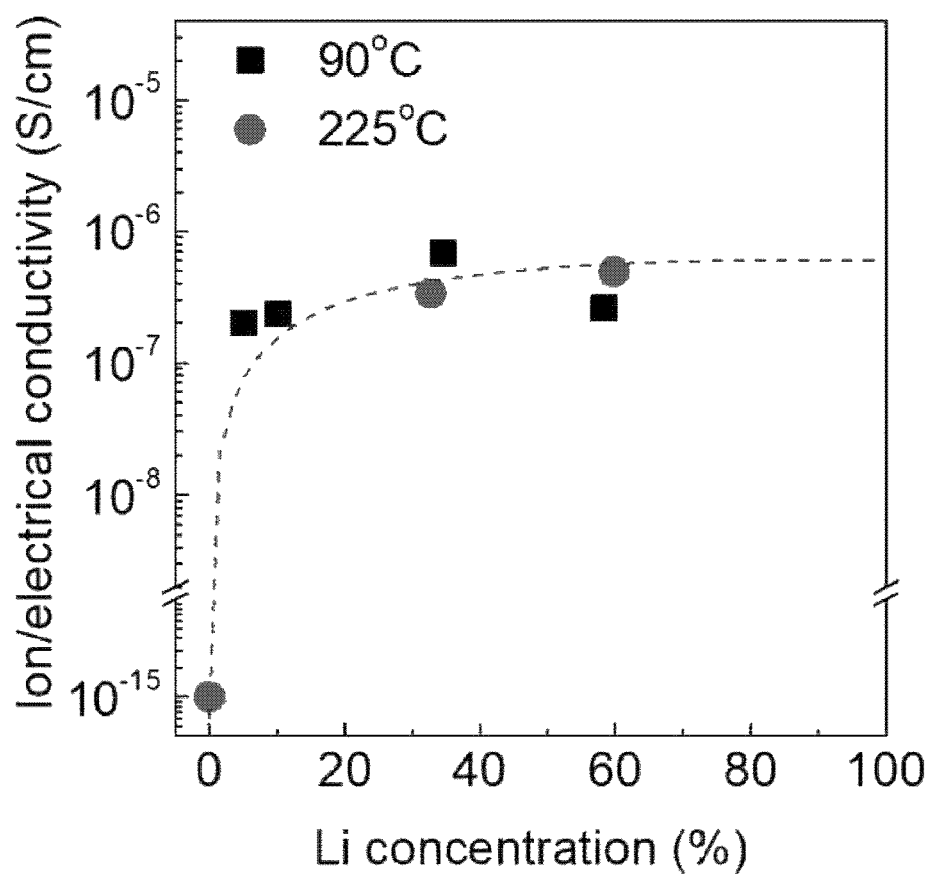
FIG. 14 is a graph showing ionic conductivity of resistance change layers formed at different temperatures.

FIG. 13 is a graph showing the growth rates of resistance change layers formed at different temperatures. FIG. 14 is a graph showing ionic conductivity of resistance change layers formed at different temperatures.

Referring to FIGS. 13 and 14, FIG. 13 shows that memory devices including resistance change layers formed at temperatures of 90° C. and 225° C., respectively, and the growth rates of the first resistance change layer formed according to the first unit process and the second resistance change layer formed according to the second unit process were measured. FIG. 14 shows that the ion conductivities (S/cm) according to the Li concentration of the resistance change layer included in the memory device were measured.

As shown in FIGS. 13 and 14, it was confirmed that the growth rates are significantly different according to the temperatures of forming the resistance change layers, however, the ionic conductivities are substantially consistent with each other. In other words, it can be seen that the ionic conductivity is effected not by the temperature of forming the resistance change layer but by the Li concentration in the resistance change layer.

As a result, since the growth rate of the resistance change layer at the relatively low temperature (90° C.) is higher than the growth rate of the resistance change layer at the relatively high temperature (225° C.), it can be seen that it is effective to form the resistance change layer under the process conditions of 90° C. or less in order to form the resistance change layer having a high Li content.

Manufacturing of a Memory Device According to Experimental Example 6

After a lower titanium nitride (TiN) electrode was formed on an SiO2 substrate, processes of LiOtBu providing-purge-H2O providing-purge-TTIP providing-purge-H2O providing-purge were performed to form a resistance change layer at a temperature of 225° C., and an upper titanium nitride (TiN) electrode was formed on the resistance change layer, so that a memory device according to the embodiment was manufactured.

In the above-described process, the LiOtBu providing-purge-H2O providing-purged was defined as a first unit process, the TTIP providing-purge-H2O providing-purge was defined as a second unit process, and each unit process was repeated.

More specifically, the ratio between the first unit process and the second unit process was controlled to 1:1, so that the Li concentration(Li/(Li+Ti)) in the resistance change layer was controlled to 72 at %. Thus, a memory device according to Experimental Example 6 was manufactured.

Manufacturing of a Memory Device According to Experimental Example 7

The same process as in Experimental Example 1 described above was performed except that the ratio between the first unit process and the second unit process was controlled to 1:4, so that the Li concentration(Li/(Li+Ti)) in the resistance change layer was controlled to 46 at %. Thus, a memory device according to Experimental Example 7 was manufactured.

Manufacturing of a Memory Device According to Experimental Example 8

The same process as in Experimental Example 1 described above was performed except that the ratio between the first unit process and the second unit process was controlled to 1:7, so that the Li concentration(Li/(Li+Ti)) in the resistance change layer was controlled to 37 at %. Thus, a memory device according to Experimental Example 8 was manufactured.

Manufacturing of a Memory Device According to Experimental Example 9

The same process as in Experimental Example 1 described above was performed except that the ratio between the first unit process and the second unit process was controlled to 1:15, so that the Li concentration(Li/(Li+Ti)) in the resistance change layer was controlled to 31 at %. Thus, a memory device according to Experimental Example 9 was manufactured.

The manufacturing processes of the memory devices according to the above-described Experimental Examples 6 to 9 may be summarized as shown in Table 1 below.

TABLE 2

| Item | First unit process:second unit process | Li content (Li/(Li + Ti)) |
|---|---|---|
| Experimental Example 6 | 1:1 | 72 at % |
| Experimental Example 7 | 1:4 | 46 at % |
| Experimental Example 8 | 1:7 | 37 at % |
| Experimental Example 9 | 1:15 | 31 at % |

Figure 15:
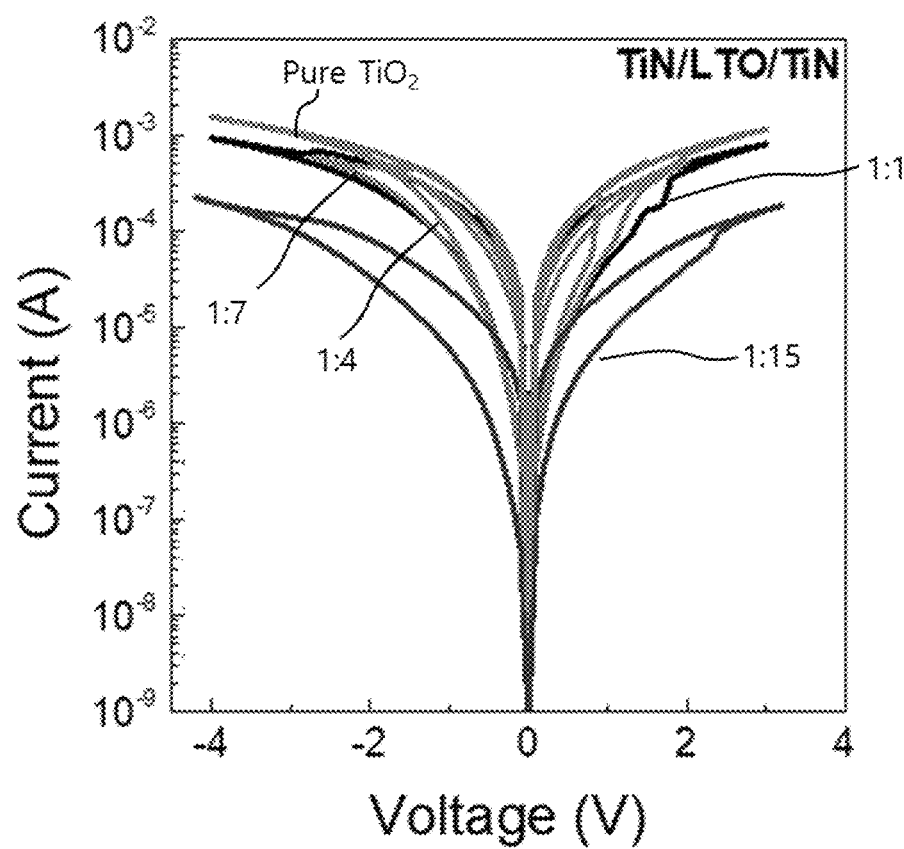
FIGS. 15 and 16 are graphs showing operating current characteristics of memory devices according to Experimental Examples 6 to 9 of the present invention.
Figure 16:
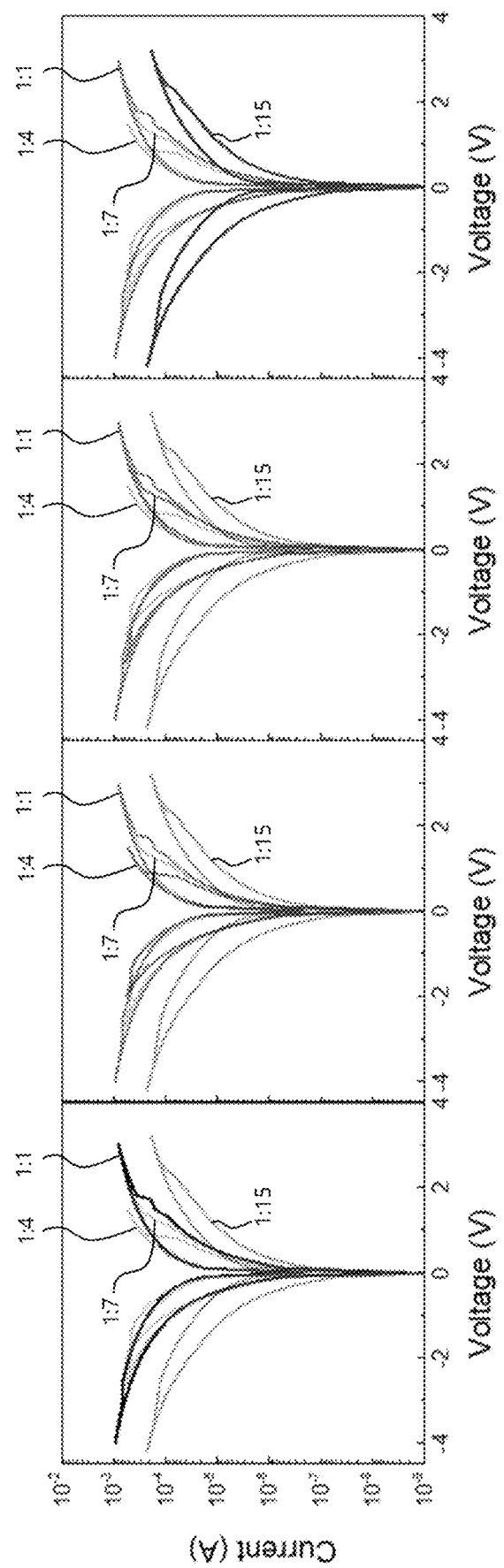

FIGS. 15 and 16 are graphs showing operating current characteristics of memory devices according to Experimental Examples 6 to 9 of the present invention.

Referring to FIGS. 15 and 16, the operating currents according to the operating voltages of the memory devices according to Experimental Examples 6 to 9 were measured.

As shown in FIGS. 15 and 16, it can be seen that when the Li concentration is high, the operating voltage is remarkably increased. Then, it can be confirmed that, as the Li concentration is decreased, the operating voltage is remarkably decreased, and then gradually increased.

Figure 17:
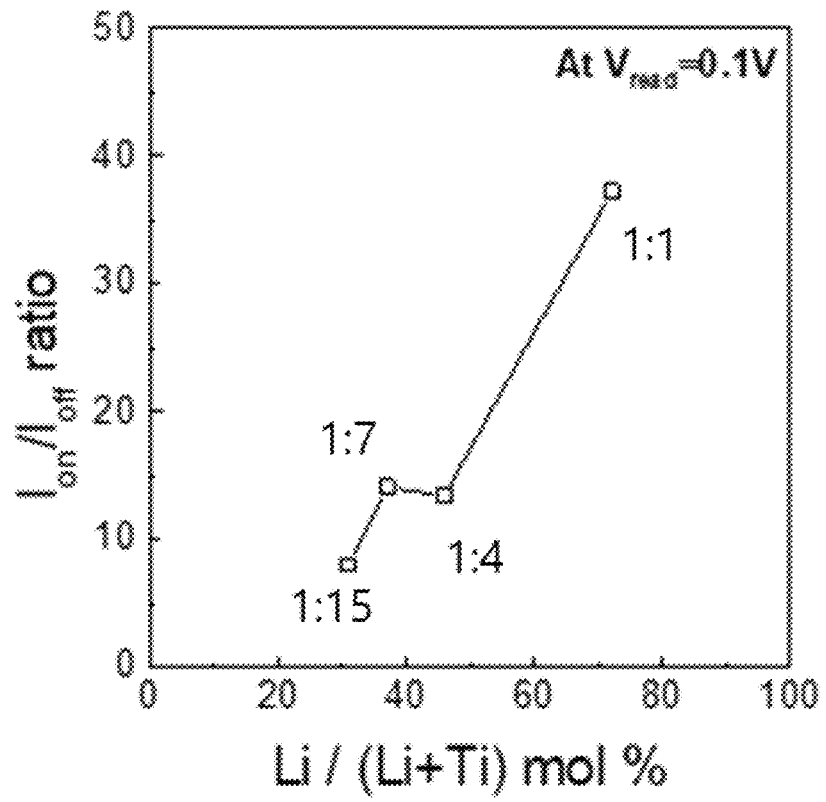
FIG. 17 is a graph showing the Ion/Ioff ratios and operating voltages of memory devices according to Experimental Examples 6 to 9 of the present invention.
Figure 17:
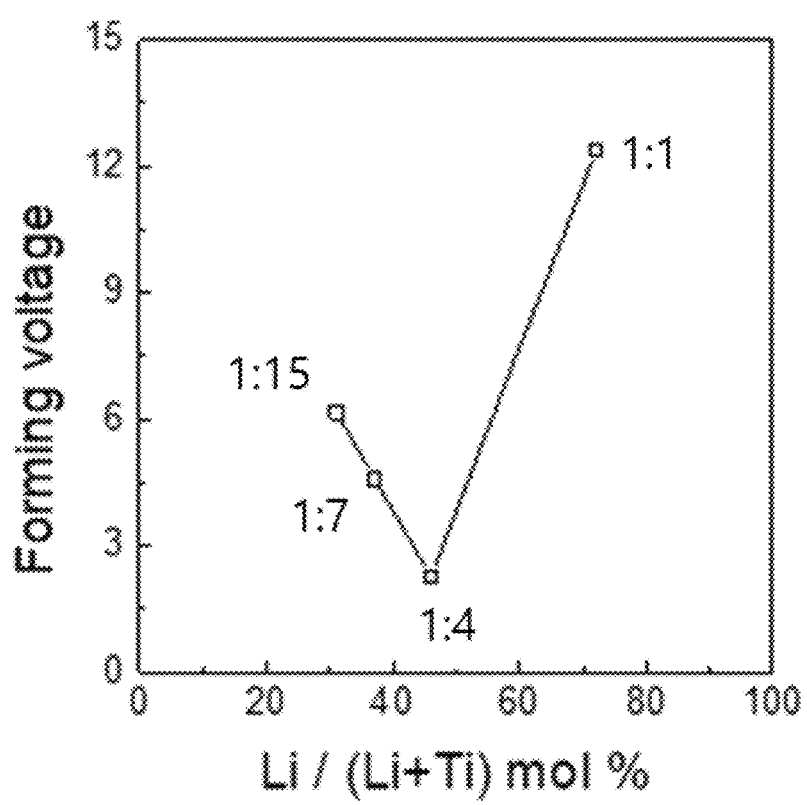

FIG. 17 is a graph showing the Ion/Ioff ratios and operating voltages of memory devices according to Experimental Examples 6 to 9 of the present invention.

Referring to FIG. 17, the on/off characteristics (Ion/Ioff ratio) and the operating voltages of the memory devices according to Experimental Examples 6 to 9 were measured according to the lithium concentration.

As shown in FIG. 17, it can be confirmed that the Ion/Ioff ratio is increased when the Li concentration is increased. However, it can be confirmed that, when the Li concentration is high, a large amount of lithium carbonate is formed in the resistance change layer, so that a high operating voltage is generated.

Accordingly, it can be confirmed that it is efficient to control the ratio between the first unit process and the second unit process from 1:7 to 1:1 for the low power driving. In other words, it is efficient to control the concentration of Li to more than 37 at % and less than 72 at %.

Although the present invention has been described in detail with reference to the exemplary embodiments, the present invention is not limited to the specific embodiments and shall be interpreted by the following claims. In addition, it will be apparent that a person having ordinary skill in the art may carry out various deformations and modifications for the embodiments described as above within the scope without departing from the present invention.

INDUSTRIAL APPLICABILITY

The memory device and the manufacturing method therefor according to the embodiments of the present invention may be used as a next-generation low-power memory as a device having the reduced power consumption and the improved operating speed.

The invention claimed is:

1. A memory device comprising:
a first electrode;
a resistance change layer disposed on the first electrode and including lithium, aluminum, and oxygen; and
a second electrode disposed on the resistance change layer,
wherein the resistance change layer has a lithium content ratio Li/(Li+Al) that is more than 40 at % and less than 60 at %.

2. The memory device of claim 1, wherein the lithium content ratio Li/(Li+Al) is more than 50 at %.

3. The memory device of claim 1, wherein the resistance change layer includes a plurality of first resistance change layers that include lithium, and that are alternatively disposed with a plurality of second resistance change layers that include aluminum.

4. A CBRAM comprising a memory device according to claim 1.

5. A method of manufacturing a memory device, the method comprising:
forming a first electrode on a substrate;
performing a first unit process for reacting a first precursor that includes lithium with a first reaction source that includes oxygen;
performing a second unit process for reacting a second precursor that includes aluminum with a second reaction source that includes oxygen, wherein performing the first unit process and the second unit process result in formation of a resistance change layer that includes lithium, aluminum, and oxygen on the first electrode; and
forming a second electrode on the resistance change layer,
wherein the first unit process and the second unit process are separately and repeatedly performed a plurality of times, in which a repetition ratio between the first unit process and the second unit process is controlled, thereby controlling a lithium content ratio Li/(Li+Al) in the resistance change layer.

6. The method of claim 5, wherein the repetition ratio between the first unit process and the second unit process is controlled such that a repetition rate of the first unit process is more than 4 times and less than 16 times compared to a repetition rate of the second unit process.

7. The method of claim 5, wherein
the first unit process includes providing the first precursor on the first electrode and providing the first reaction source on the first electrode provided with the first precursor, and
the second unit process includes providing the second precursor on the first electrode and providing the second reaction source on the first electrode provided with the second precursor.

8. The method of claim 5, wherein temperatures of the first unit process and the second unit process are controlled such that the lithium content ratio Li/(Li+Al) in the resistance change layer is more than 50 at % and less than 88 at %.

9. The method of claim 8, wherein the first unit process and the second unit process are performed at a temperature of 90° C.

10. The method of claim 5, wherein
the first precursor includes lithium bis(trimethylsilyl)amide (LiHMDS) or lithium tert-butoxide (LiOtBu), and
the second precursor includes trimethylaluminium (TMA).

11. The method of claim 5, wherein
the first reaction source and the second reaction source are identical to each other, and
the first reaction source and the second reaction source include H2O or ozone (O3).

12. A memory device comprising:
a first electrode;
a resistance change layer disposed on the first electrode and comprising lithium, titanium, and oxygen; and
a second electrode disposed on the resistance change layer,
wherein the resistance change layer has a lithium content ratio Li/(Li+Ti) that is more than 37 at % and less than 72 at %, and
wherein the resistance change layer comprises a plurality of first resistance change layers that comprise lithium, and that are alternatively disposed with a plurality of second resistance change layers that comprise titanium.

13. The memory device of claim 12, wherein the lithium content ratio Li/(Li+Ti) is less than 46 at %.

14. A method of manufacturing a memory device, the method comprising:
forming a first electrode on a substrate;

performing a first unit process for reacting a first precursor that comprises lithium with a first reaction source that comprises oxygen;

performing a second unit process for reacting a second precursor that comprises titanium with a second reaction source that comprises oxygen, wherein performing the first unit process and the second unit process result in formation of a resistance change layer that comprises lithium, titanium, and oxygen on the first electrode; and forming a second electrode on the resistance change layer, wherein the first unit process and the second unit process are separately and repeatedly performed a plurality of times, in which a repetition ratio between the first unit process and the second unit process is controlled, thereby controlling a lithium content ratio Li/(Li+Ti) in the resistance change layer.

15. The method of claim 14, wherein
the first precursor comprises lithium bis(trimethylsilyl) amide (LiHMDS) or lithium tert-butoxide (LiOtBu), and
the second precursor comprises titanium isopropoxide (TTIP).

16. The method of claim 14, wherein the repetition ratio between the first unit process and the second unit process is controlled such that a repetition rate of the first unit process is more than 4 times and less than 16 times compared to a repetition rate of the second unit process.

17. The method of claim 14, wherein
the first reaction source and the second reaction source are identical to each other, and
the first reaction source and the second reaction source comprise H2O or ozone (O3).

18. The method of claim 14, wherein:
the first unit process comprises providing the first precursor on the first electrode and providing the first reaction source on the first electrode provided with the first precursor, and
the second unit process comprises providing the second precursor on the first electrode and providing the second reaction source on the first electrode provided with the second precursor.

* * * * *